United States Patent
Ishikawa et al.

(10) Patent No.: US 9,241,418 B2
(45) Date of Patent: Jan. 19, 2016

(54) SURFACE MOUNT DEVICE

(71) Applicant: NIHON DEMPA KOGYO CO., LTD., Tokyo (JP)

(72) Inventors: Takayuki Ishikawa, Saitama (JP); Shinichi Sato, Saitama (JP); Kazuo Akaike, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 301 days.

(21) Appl. No.: 13/916,597

(22) Filed: Jun. 13, 2013

(65) Prior Publication Data

US 2013/0342980 A1 Dec. 26, 2013

(30) Foreign Application Priority Data

Jun. 20, 2012 (JP) .................................. 2012-139136

(51) Int. Cl.
*H05K 5/00* (2006.01)
*H05K 7/10* (2006.01)
*H05K 7/14* (2006.01)

(52) U.S. Cl.
CPC ............ *H05K 7/1053* (2013.01); *H05K 5/0091* (2013.01); *H05K 7/142* (2013.01)

(58) Field of Classification Search
CPC .... H05K 5/0091; H05K 7/1053; H05K 7/142
USPC ....... 174/51, 52.1, 138 G; 361/753, 742, 758, 361/730, 741, 727
See application file for complete search history.

(56) References Cited

U.S. PATENT DOCUMENTS

| | | | |
|---|---|---|---|
| 2007/0008709 A1* | 1/2007 | Ikeya et al. | .................... 361/810 |
| 2008/0079505 A1* | 4/2008 | Kuroda | ............................ 331/68 |
| 2009/0212878 A1* | 8/2009 | Arai et al. | ...................... 331/158 |
| 2009/0256641 A1* | 10/2009 | Lee et al. | .......................... 331/66 |

FOREIGN PATENT DOCUMENTS

| | | |
|---|---|---|
| JP | 06-509686 | 10/1994 |
| JP | 2002-505513 | 2/2002 |
| JP | 2005-085863 | 3/2005 |
| JP | 2008-085744 | 4/2008 |

\* cited by examiner

*Primary Examiner* — Yuriy Semenenko
(74) *Attorney, Agent, or Firm* — Jianq Chyun IP Office (57) ABSTRACT

A surface mount device in which a pin adapter that is integrally formed with a plurality of pins connects a base board and a main board is provided to enable an automatic mounting, to enable a reflow soldering, to increase the flexibility of design, and to satisfy requirements of customers. In the surface mount device, a pin adapter 5 that is formed integrally with a plurality of pins 6 is placed on a base board 1, the base board 1 and the main board 2 are connected by inserting the tips of the pins 6 into the corresponding locations of the main board 2, the leg portions of the pin adapter 5 are folded toward inside, and opening sections 52 are formed at the leg portions.

7 Claims, 13 Drawing Sheets

SURFACE MOUNT DEVICE

CROSS REFERENCE TO RELATED APPLICATIONS

This application claims the priority benefit of Japan application serial no. 2012-139136, filed on Jun. 20, 2012. The entirety of the above-mentioned patent application is hereby incorporated by reference herein and made a part of this specification.

TECHNICAL FIELD

This disclosure relates to a surface mount device, especially to a surface mount device that can be implemented automatically and can be reflowed to increase the flexibility of design.

DESCRIPTION OF THE RELATED ART

As an surface mount device (SMD), a surface mount piezoelectric oscillator, which has electronic components such as a crystal unit mounted on a main board that is fixed to a base circuit board by a plural of pins, and which is covered by a cover, has been known. This surface mount piezoelectric oscillator is, for example, used for an oven controlled crystal oscillator (OCXO). The OCXO keeps temperatures of a crystal oscillator or a crystal unit constant by using a thermostatic oven, and decreases variations of outputted frequency due to changes of surrounding temperatures.

Figure 12:
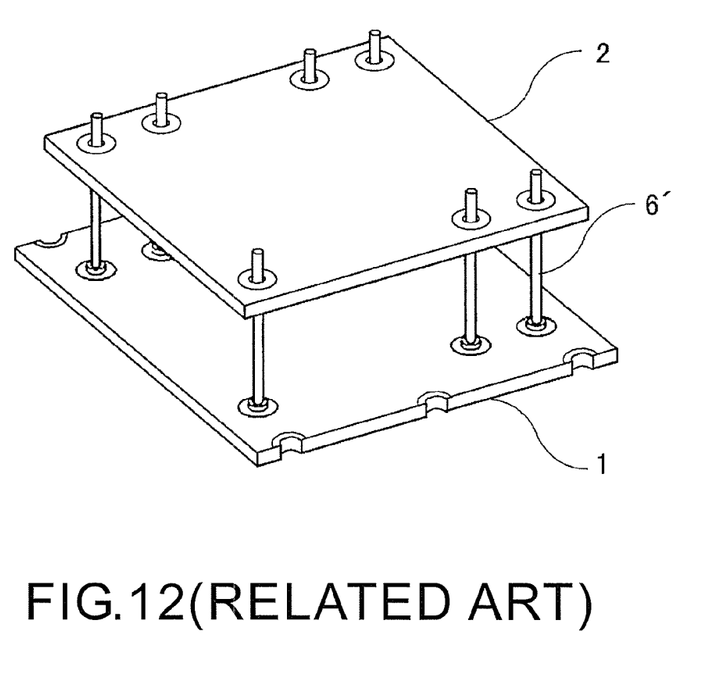
FIG. 12 shows a diagram of the conventional OCXO.
Figure 13:
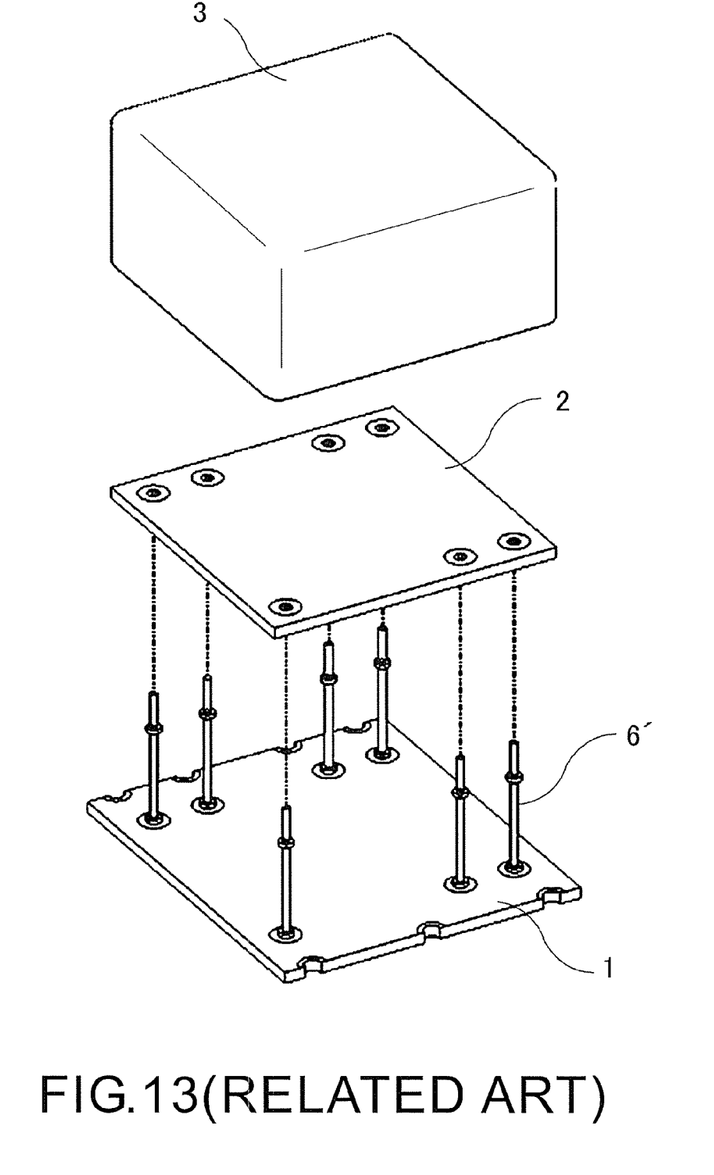
FIG. 13 shows a diagram of the conventional OCXO, each portion of which is separated and seen from upward.
Figure 14:
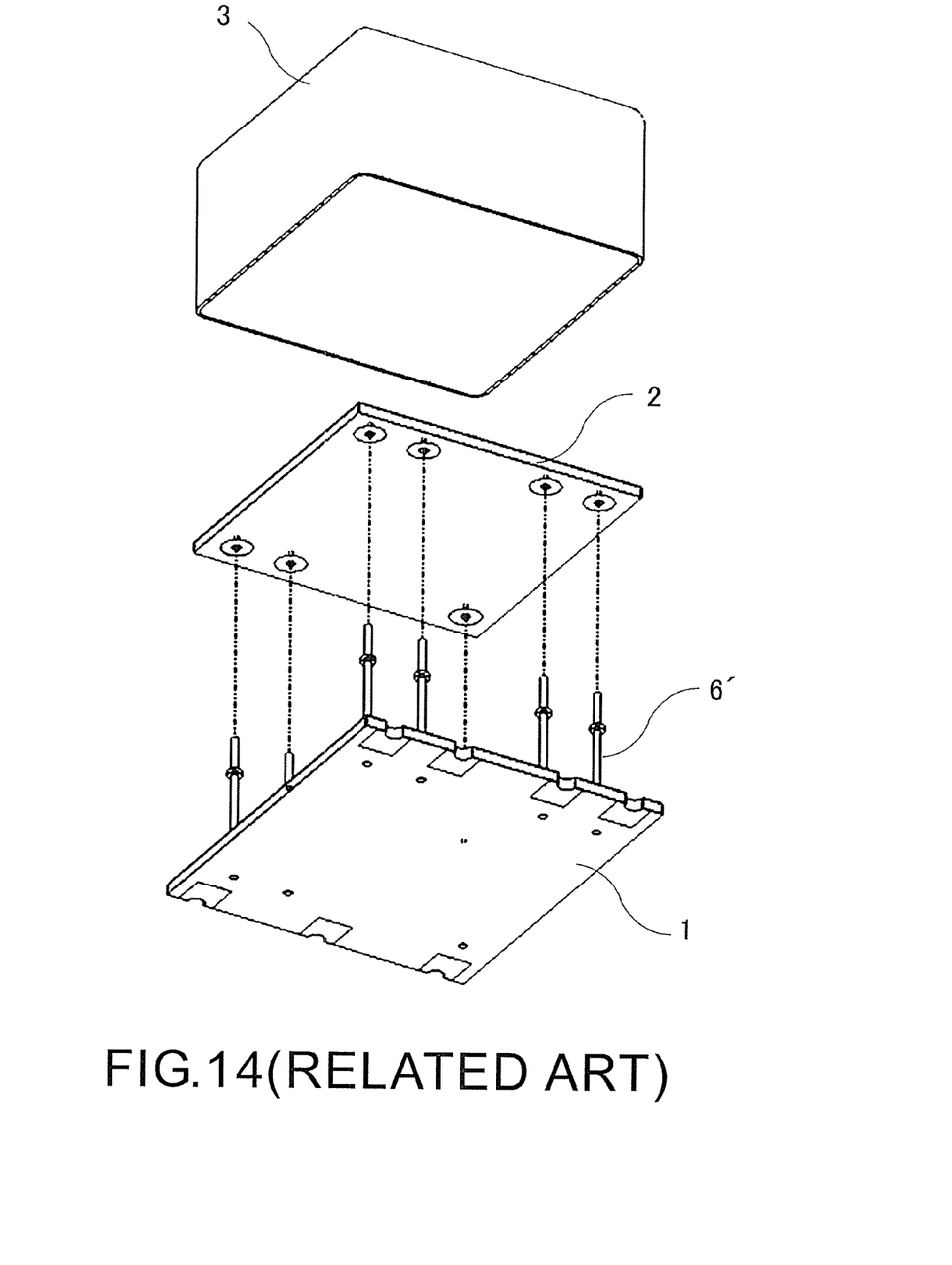
FIG. 14 shows a diagram of the conventional OCXO, each portion of which is separated and seen from downward.

A configuration of a conventional OCXO is explained by referring to FIGS. 12-14. FIG. 12 shows a diagram of the conventional OCXO. FIG. 13 shows a diagram of the conventional OCXO, each portion of which is separated and seen from upward. FIG. 14 shows a diagram of the conventional OCXO, each portion of which is separated and seen from downward. In the conventional OCXO, electronic components such as a crystal unit etc. are mounted on a main board 2, the main board 2 is connected to a base board 1 by a plurality of pins 6', and a cover 3 is arranged to cover the main board 2.

The crystal unit that is mounted on the main circuit 2 is a Dual In-line Package (DIP) type crystal unit. A Dual In-line Package type is a package of which leads or pins extracted from both sides of the body are inserted into holes drilled in a circuit board to be mounted on the circuit board.

In order to connect the base board 1 and the main board 2 by using the pins 6', a plurality of holes (through holes) for inserting the pins 6' are made in the base board 1, and a plurality of holes (through holes) are also made at corresponding positions of the main board 2. One end of the pins 6' are inserted into the holes of the base board 1, and opposite end of the pins 6' are inserted into the corresponding holes of the main board 2 with the plurality of the pins 6' stood in a vertical direction to connect the base board 1 with the main board 2.

The conventional OCXO is enable to be a surface mount device by using the base board 1, and the size of the OCXO is determined by the size of a crystal unit, which is a main component of the OCXO. Additionally, although a heater component for keeping the temperature of the crystal unit constant is placed on the main board 2, heat moves to the base board 1 and to an external user board through metallic pins, and thereby the heater component increases the power consumption to increase temperature. Therefore, material with lower thermal conductivity is preferable for the pin.

Japanese Unexamined Patent Application Publication No. 2005-085863, "An electronic circuit unit" by Alps Electric Co. Ltd. (Patent Document 1); Japanese Unexamined Patent Application Publication No. 2008-085744, "A piezoelectric oscillator for surface mounting" by Nihon Dempa Kogyo Co. Ltd. (Patent Document 2); Japanese Unexamined Patent Application Publication No. 06-509686, "A package of an electric component" by VLT Corporation (Patent Document 3); and Japanese Unexamined Patent Application Publication No. 2002-505513, "A contact strip for connecting two circuit boards and a method for manufacturing a contact strip" by the Whitaker Corporation (Patent Document 4), each discloses related art.

The Patent Document 1 discloses an electronic circuit unit that comprises a circuit board attached within a frame, electronic components with a cover mounted on the circuit board, and a plurality of linear terminals that penetrate the circuit board to be coupled to the circuit board. The Patent Document 2 discloses a piezoelectric oscillator for surface mounting, in which concave portions are formed on a base board, metallic pillars are fixed to the concave portions, a sub printed circuit board is supported by the metallic pillars, and a cover is placed.

The Patent Document 3 discloses an electronic component package in which a multi-layered printed circuit board (PCB) is formed on a base board via an insulating sheet, a fence in which pins are inserted is attached to marginal portions of the printed circuit board, and the pins are inserted into holes formed in a caging.

The Patent Document 4 discloses a configuration with a contact strip that electronically and mechanically connects two circuit boards.

However, in the conventional surface mount device, a base board and a main board are connected by putting a plurality of pins to the base board and by inserting the pins to holes of the main board. Therefore, there were such problems that a vertical accuracy of the pins are required, that assembling the device is difficult, and that the pins cannot be implemented automatically.

Also, the conventional surface mount device had a problem that pins as electrode terminals and electrode patterns that are formed on the base board could not be connected by a reflow soldering, since an automatic mounting could not be used.

Also, the conventional surface mount device had a problem that mounting positions of internal components and arrangements of pins were influenced by mounting pads for customers (user board), and that the flexibility of design was not enough due to limitations of the arrangement.

Furthermore, since the pins of the conventional surface mount device were inserted to the holes of the base board, there was a problem that some customers judged the device to be defective due to the pins visible from the bottom face of the base board, and the requirements of customers were not satisfied.

The Patent Documents 1 to 4 do not disclose that an automatic mounting is enabled by integrally forming a plurality of pins on a pin adapter to make it easy to mount the pin adapter on the base board.

SUMMARY

The present disclosure is created in view of the aforementioned circumstances, and the present disclosure is to provide a surface mount device that enables an automatic mounting by connecting a base board and a main board by a pin adapter on which a plurality pins are integrally formed, that enables a solder connection and a reflow, that enhances flexibility of design, and that meets the requirements of customers.

According to one of the aspects of the present disclosure, a surface mount device comprises: a main board on which electronic components are mounted; a base board; and a pin adapter, having a plurality of pins and the pin adapter is are fixed on the base board, wherein tips of the pins that are narrower than the other portions of the pins are inserted into holes disposed in the main board, and the main board and the base board are connected with each other.

According to one of the aspects of the present disclosure, a surface mount device comprises: a main board on which electronic components are mounted; a base board; and a pin adapter formed by integrating a plurality of metallic pins stood in a vertical direction and the pin adapter is placed on the base board, wherein tips of the pins are inserted into holes disposed at corresponding positions of the main board to connect the main board and the base board, and a cover is placed to cover the main board and the pin adapter.

DESCRIPTION OF EXEMPLARY EMBODIMENTS

The First Embodiment

The embodiment of the present disclosure is explained by referring to figures. The surface mount device according to the present embodiment of this disclosure comprises a pin adapter integrally formed with a plurality of pins on a base board. The surface mount device is assembled by inserting the tips of the pins into the holes of a main board on which electronic components such as crystal units are mounted, by automatically mounting the main board to a base board, by reflow soldering the base board, and by covering the whole afterwards. Therefore, the surface mount device can be automatically mounted, and a reflow soldering can be used for the surface mount device.

Furthermore, since the main board and the pins are connected by the pin adapter, the limitation regarding the connection with a user board is small, and the flexibility of design can be enhanced. Also, since through holes for inserting pins are not made in the base board, the end portions of the pins do not stick out from the bottom face of the base board. Therefore, the customers do not judge the device to be defective, and the requirements of customers can be satisfied.

Figure 1:
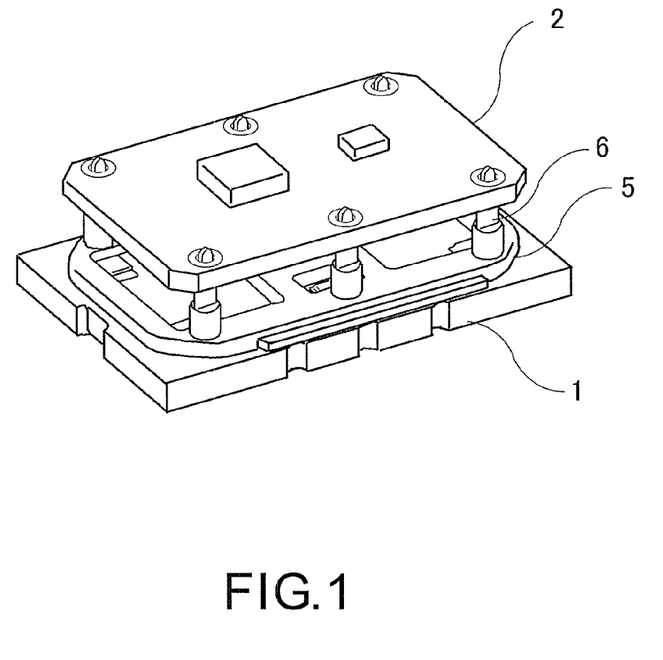
FIG. 1 shows a diagram of an OCXO according to an embodiment of the present disclosure.
Figure 2:
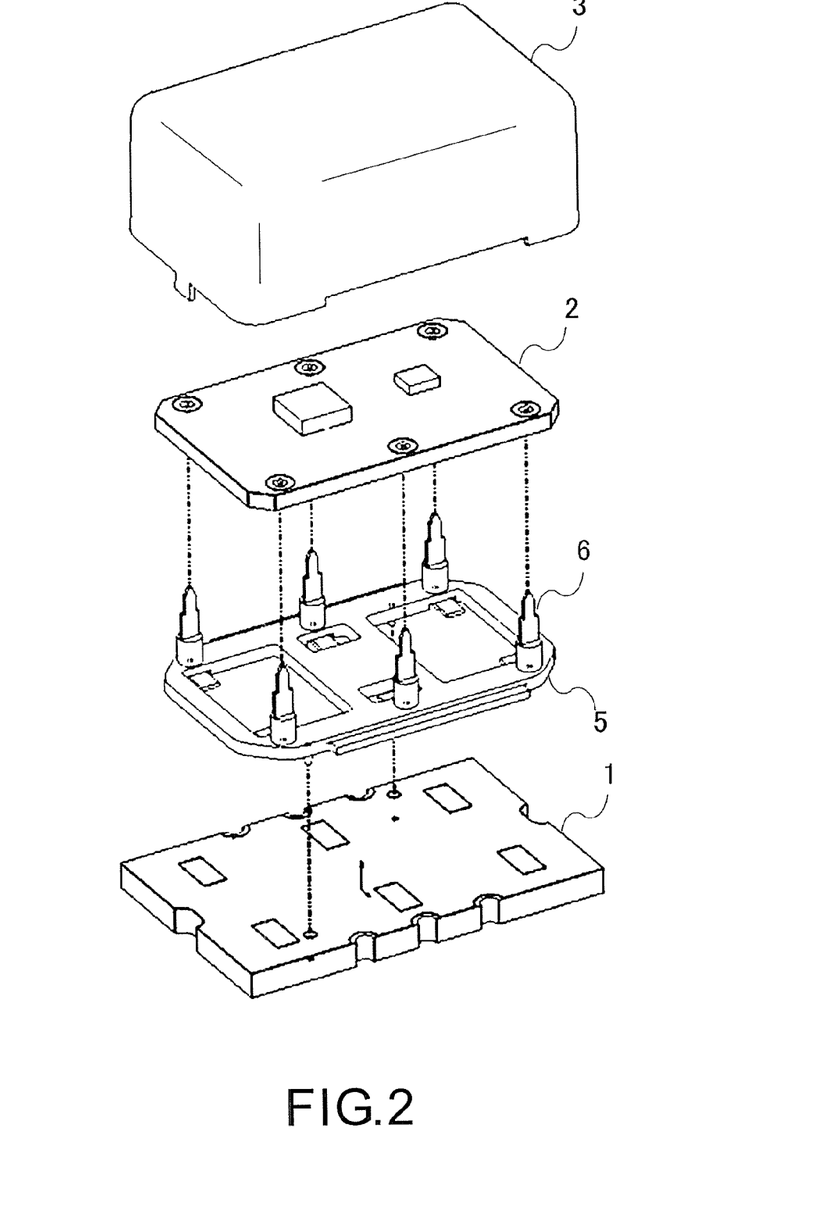
FIG. 2 shows a diagram of an OCXO, each portion of which is separated and seen from upward.
Figure 3:
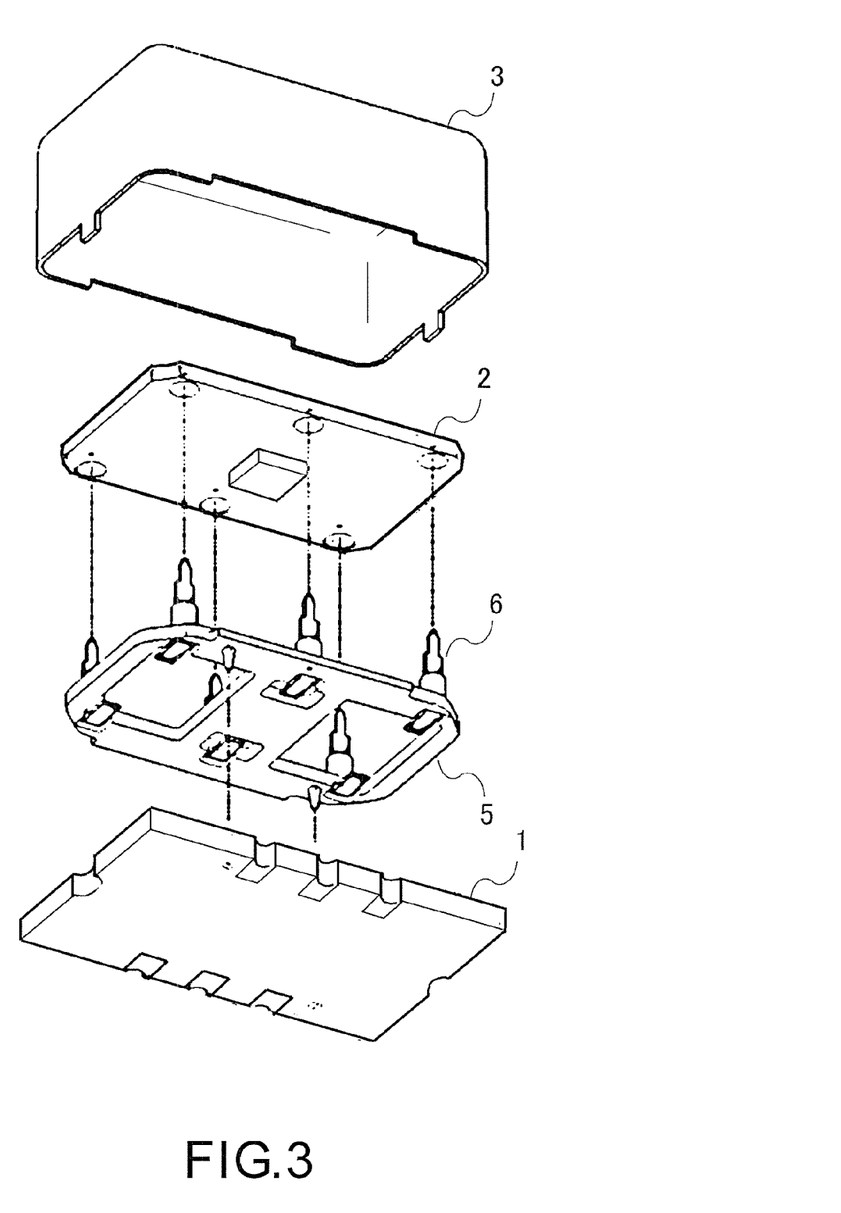
FIG. 3 shows a diagram of an OCXO, each portion of which is separated and seen from downward.

The surface mount device according to the embodiment of the present disclosure (the present device) is explained by referring to FIGS. 1-3. FIGS. 1-3 show the OCXO in which the present device is applied. FIG. 1 shows a diagram of an OCXO according to the embodiment of the present disclosure. FIG. 2 shows a diagram of an OCXO, each portion of which is separated and seen from upward. FIG. 3 shows a diagram of an OCXO, each portion of which is separated and seen from downward.

As shown in FIGS. 1-3, the OCXO according to an embodiment of the present disclosure (the present OCXO) has a configuration in which electronic components such as a crystal unit are mounted on a main board 2, a pin adapter 5 integrally formed with a plurality of pins 6 is placed on a base board 1, tips of a plurality of pins 6 are inserted into the corresponding holes of the main board 2, the main board 2 and the base board 1 are connected, and a cover 3 is placed to cover the main board 2 and the pin adapter 5. Therefore, the base board 1 has no holes for inserting pins.

Figure 4:
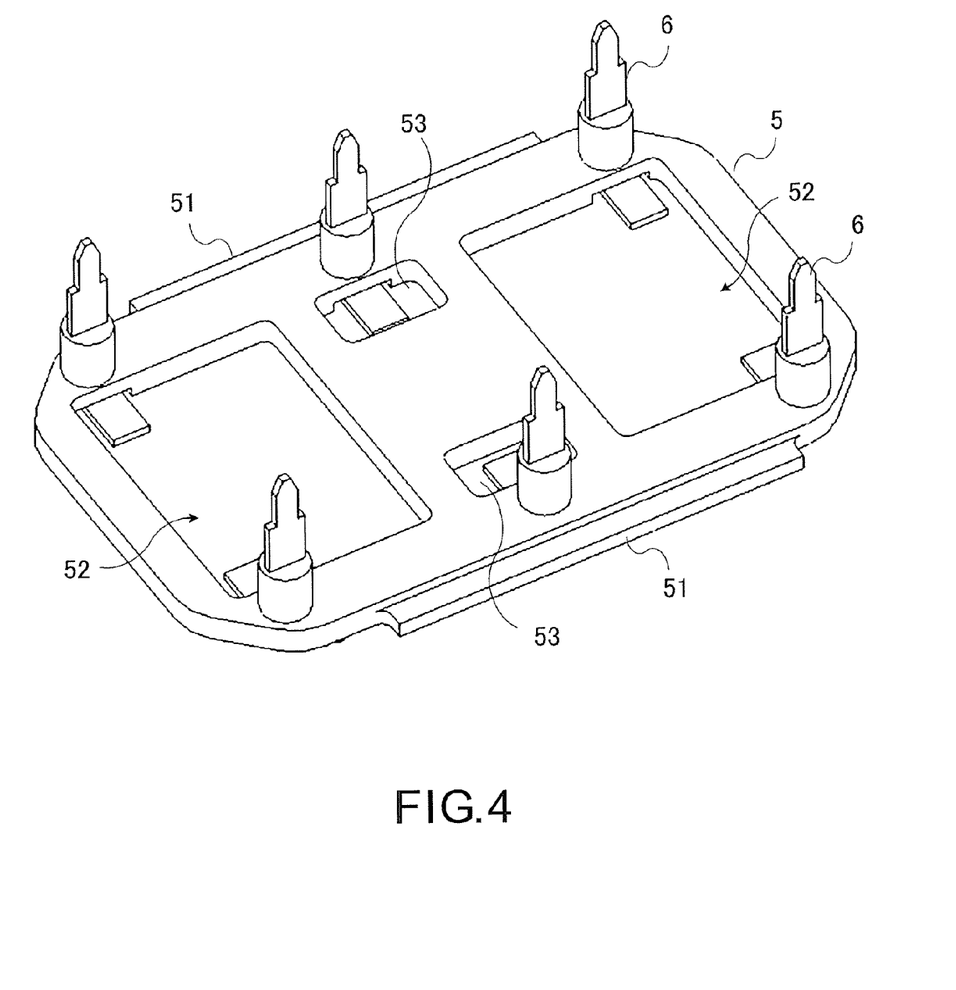
FIG. 4 shows a diagram of a pin adapter and pins seen from upward.
Figure 5:
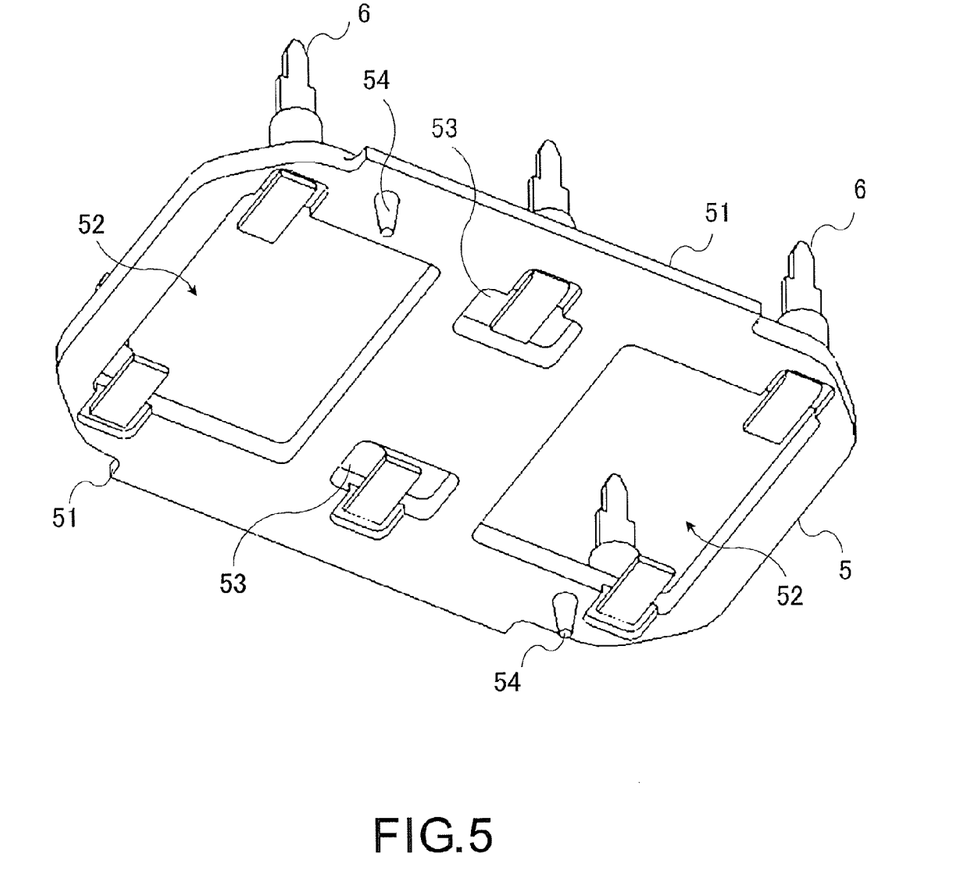
FIG. 5 shows a diagram of a pin adapter and pins seen from downward.

The pin adapter 5 and the pins 6 of the present OCXO are specifically explained by referring to FIGS. 4-5. FIG. 4 shows a diagram of the pin adapter and the pins seen from upward. FIG. 5 shows a diagram of the pin adapter and the pins seen from downward. The pin adapter 5, as shown in FIGS. 4-5, is made of plastic by thermal-resistant resin, and the pins 6 are made of conductive metal.

The pin adapter 5 is made by an insert molding for which a metal mold is used. The pin adapter 5 is formed by pouring resin with all the pins 6 inserted in a metal mold, and the pins 6 and the pin adapter 5 are integrally formed.

The pin adapter 5 has a flange 51 formed along lateral faces of both long sides of the pin adapter 5. The flange 51 is strip-shaped, projected to a little lower side from the bottom face of the pin adapter 5. The portions that contact with the base board 1 are the end portions of the flange 51, and the end portions have a role for arranging the pin adapter 5 a little above the base board 1. The flange 51 may be formed along lateral faces of both short sides of the pin adapter 5.

The flange 51 decreases the contact area where the pin adapter 5 and the base board 1 contact with each other, and inhibits thermal conductions. Also, the flange 51 makes a space between electrode patterns on the base board 1 and the folded legs of the pin 6, and enables a solder layer to be easily formed by a reflow.

The surrounding portions of the pin adapter 5 where the pins 6 are formed and the center portion for keeping the pin adapter 5 strong enough are made of plastic, a larger opening section 52 is disposed at right and left of the central portion, and a smaller opening section 53 is disposed in the area of the center portion where the legs of the pins are exposed. Here, the plastic of the surrounding portion is called as "a surrounding frame portion," the plastic of the central portion is called as "a central frame portion," and the pair of both portions is called as "a frame portion." Through these opening sections 52 and 53, the folded bottom portion of the pin 6 and the electrode pattern of the base board 1 can be soldered by a reflow.

In the surrounding frame portion of the pin adapter 5, a column-shaped supporting portion that supports the pin 6 by wrapping the surrounding of the pin 6 is placed in a vertical direction. This supporting portion can keep the accuracy in the vertical direction and the strength of the pin 6.

As shown in FIG. 5, position-determining pins 54 are formed at two positions on the bottom face, concave portions that correspond to the position-determining pins 54 are formed on the base board 1, and the position-determining pins 54 are inserted into the concave portions of the base board 1, so that a misalignment of the pin adapter 5 relative to the base board 1 is prevented.

Each of the pins 6 has an uneven portion where the width of the pin changes. The width between the uneven portion and the tip is narrower than the width between the uneven portion and the end. The tip portion of the pin 6 with the narrower width is inserted into a hole of the main board 2, the end of the pin 6 with the wider width is not inserted into the hole, and the main board 2 is held up by the uneven portions around the holes. In other words, the size of the holes of the main board 2 is large enough for inserting the tip of the pin 6 with the narrower width, and is not large enough for inserting the pin 6 with the wider width.

Furthermore, the leg portion of the pins 6 is strip-shaped, and the leg portion is folded toward inside on the bottom face of the pin adapter 5. Metallic electrode patterns that correspond to the leg portions of the pins 6 are formed on the surface of the base board 1, and the leg portions of the pins 6 and the metallic electrode patterns are connected by a reflow soldering. Through terminals are placed at the lateral face of the long side of the base board 1 that are connected to the metallic electrodes on the back side by connecting to the patterns of the metallic electrodes.

The pin adapter 5 does not allow the pins to penetrate through holes formed in the base board 1, and so the location of the pins 6 can be arbitrarily changed according to the locations of electronic components mounted on the main board 2 without being influenced by the specification of the user board. Also, the number of pins 6, which is six in FIGS. 4 and 5, can be other number, such as ten, and so the flexibility of design can be increased.

Figure 6:
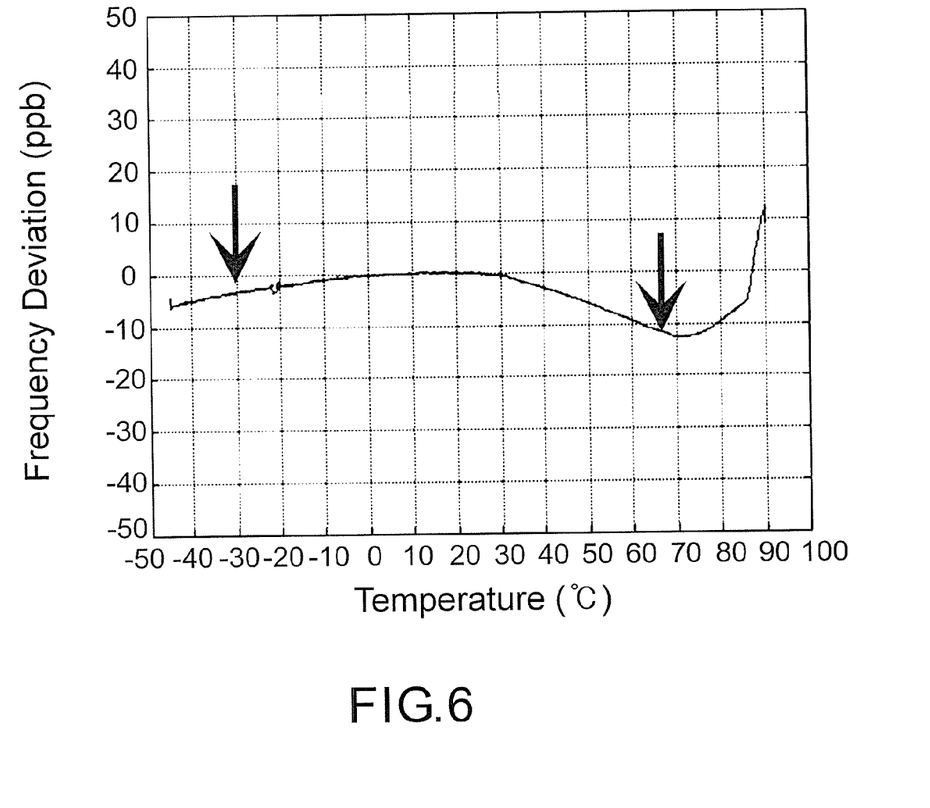
FIG. 6 shows temperature-frequency characteristics of the OCXO.

The temperature-frequency characteristics of the present OCXO is explained by referring to FIG. 6. FIG. 6 shows temperature-frequency characteristics. In the present OCXO, a composition metal of iron and nickel (for example, 42 alloy, kovar, etc.) is used for the pin 6. Due to a small loss of current, relatively flat characteristics of temperature were obtained.

Figure 7:
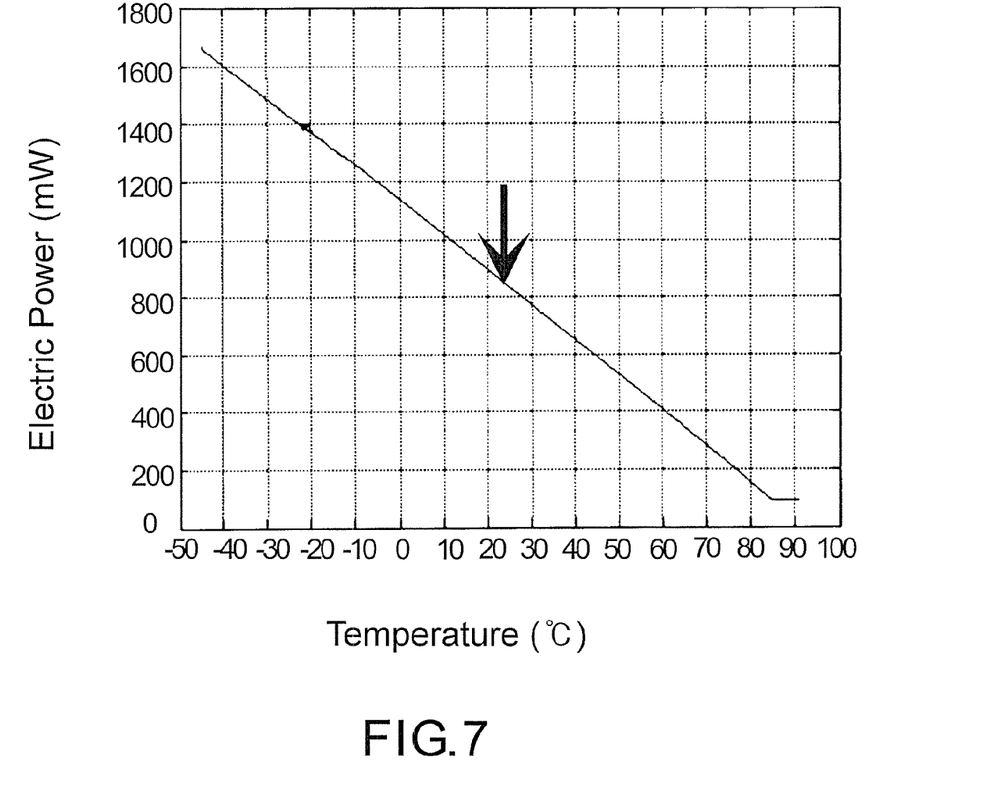
FIG. 7 shows temperature-current characteristics of the OCXO.

The temperature-current characteristics of the present OCXO is explained by referring to FIG. 7. FIG. 7 shows the temperature-current characteristics. Although the temperature-frequency characteristics were good as shown in FIG. 6, the current was increased due to the high thermal conductivity as shown in FIG. 7.

The Second Embodiment

A surface mount device according to alternate embodiment (alternate device) is explained. Especially, the OCXO for which this alternate device is used (alternate OCXO) is explained. Alternate OCXO is basically the same as the present OCXO, and what are different are the configurations of the pin adapter 5 and the pins 6.

Figure 8:
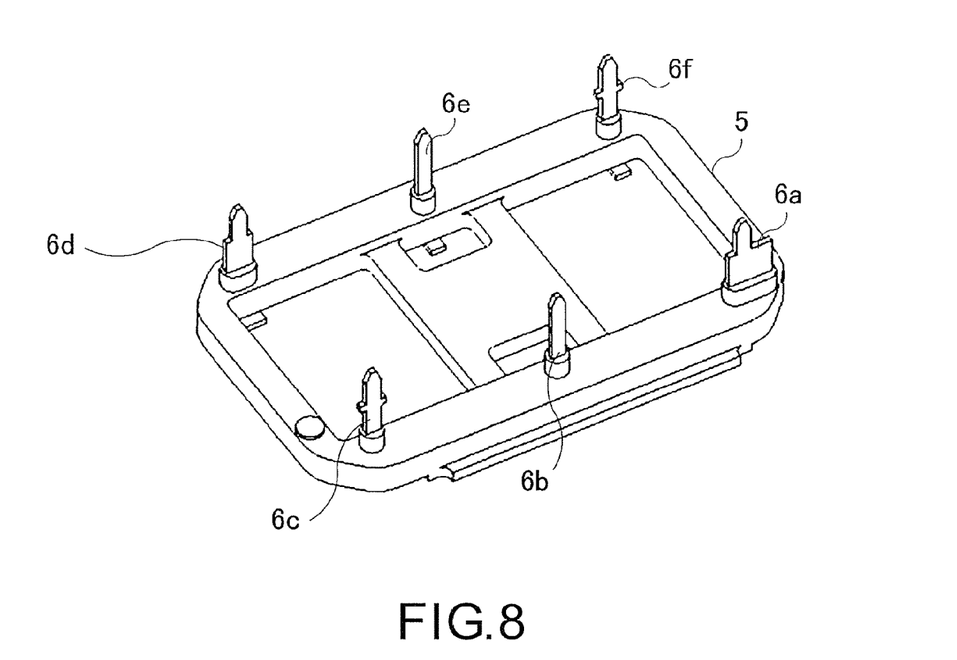
FIG. 8 shows a diagram of an alternate pin adapter and alternate pins seen from upward.
Figure 9:
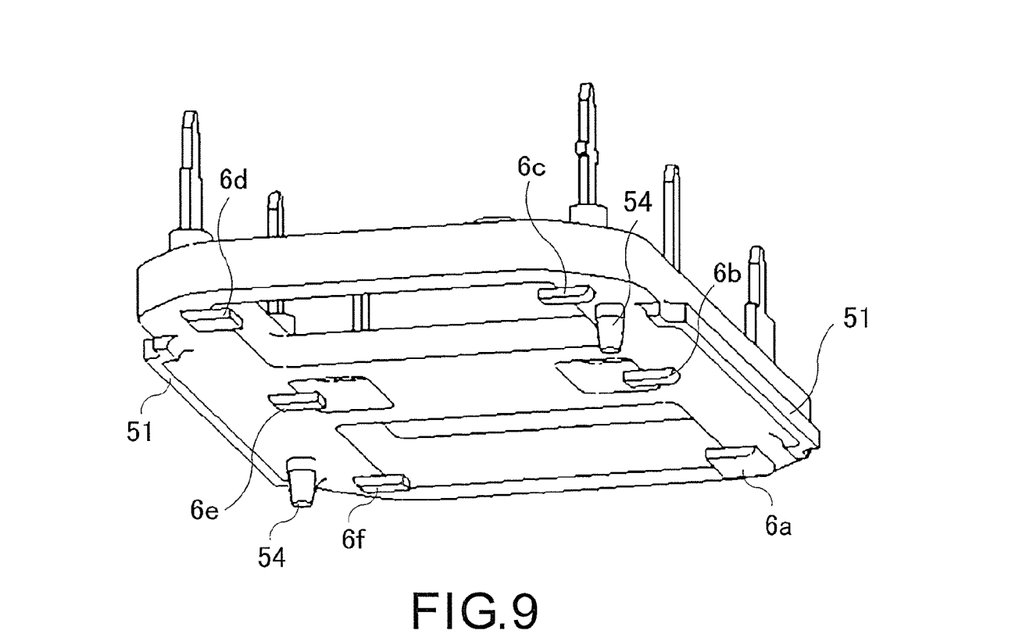
FIG. 9 shows a diagram of an alternate pin adapter and alternate pins seen from downward.

A pin adapter and pins of the alternate OCXO (an alternate pin adapter and alternate pins) are explained by referring to FIGS. 8 and 9. FIG. 8 shows a diagram of an alternate pin adapter and alternate pins seen from upward. FIG. 9 shows a diagram of an alternate pin adapter and alternate pins seen from downward. Although all the pins 6 of the present OCXO had the same shape, alternate pins have different shapes according to the locations to be placed.

Specifically, the ground (GND) pins 6a that are connected to a ground have a wider width except the tip portion, and the power pins 6d that are connected to a power supply also have a wider width. By having a wider width, a capacity of current can be increased. The widths of the other pins 6b, 6v, 6e, and 6f are as narrow (thin) as possible in order to inhibit the amount of heat to be conducted.

Similarly, the width of the folded leg portions of the pins 6 of the wider pins are wide, and that of the narrower pins are narrow. This configuration inhibits the amount of heat to be conducted by making the area contacting with the electrode of the base board 1 via a solder be small. Additionally, the uneven portion of the pins 6c and 6f, which are located at the corners of the pin adapter 5, are in a cross shape so that the main board 2 is stably coupled.

The shape of the support portion of the alternate pin adapter 5 that wraps the pin 6 is also different due to the change of the shape of the pin 6. Specifically, the pins 6a and 6d with wider pin widths have wider supporting portions, and the pins 6b, 6c, 6e, and 6f with narrower pin widths have narrower supporting portions.

A flange 51 and the position-determining pins 54 are also formed in the alternate pin adapter 5. According to the pin adapter 5 of FIG. 5, the length that the flange 51 hold up does not need to be large, because the leg portions of the pins 6 are formed in the concave portion formed on the bottom face of the pin adapter 5. However, according to the pin adapter 5 of FIG. 9, the length that the flange 51 holds up is larger than the length that the flange 51 shown in FIG. 5 holds up, because the leg portion of the pins 6 are folded sticking out from the bottom face of the pin adapter 5.

Figure 10:
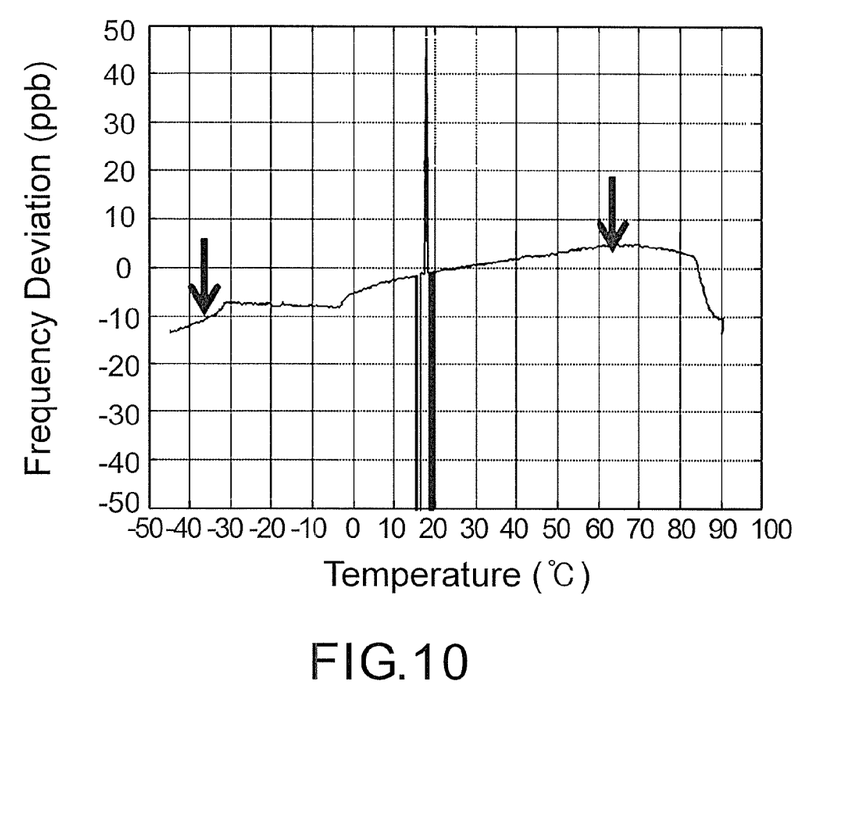
FIG. 10 shows temperature-frequency characteristics of an alternate OCXO.

The temperature-frequency characteristics of the alternate OCXO are explained by referring to FIG. 10. FIG. 10 shows the temperature-frequency characteristics of an alternate OCXO. Although the composition metal with iron and nickel was also used for the pin 6 of the alternate OCXO, and the width of the GND pin 6a and the power pin 6d were made wider, the capacity of current was slightly affected. And so, the temperature characteristics at the constant temperature side became worse, which is nevertheless within an allowable range as the characteristics of the product.

Figure 11:
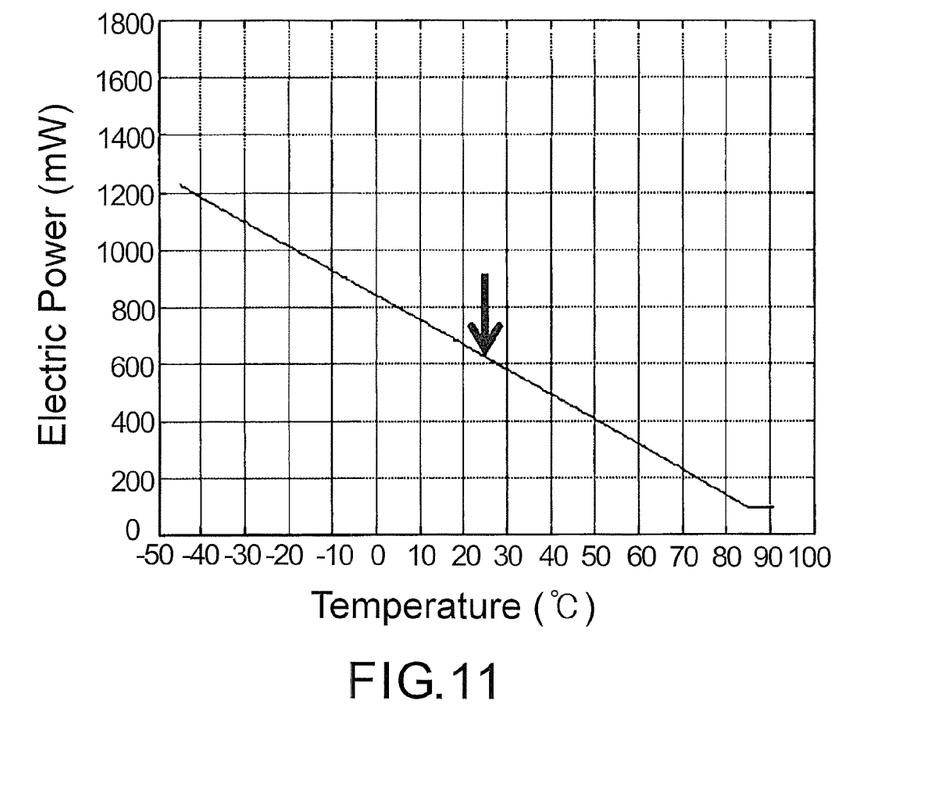
FIG. 11 shows temperature-current characteristics of an alternate OCXO.

Furthermore, the temperature-current characteristics of the alternate OCXO are explained by referring to FIG. 11. FIG. 11 shows the temperature-current characteristics of the alternate OCXO. The current was decreased as is shown in FIG. 11 because the configuration of decreasing the amount of heat to be conducted was adopted in the alternate OCXO, and the characteristics were improved compared to those of FIG. 7.

According to the present OCXO and the alternate OCXO, the pin adapter 5 that is integrally formed with the plurality of pins 6 on the base board 1, and the tip of the pins 6 are inserted into the holes at the corresponding locations of the main board 2 to connect the base board 1 and the main board 2. Therefore, effects of enabling an automatic mounting, of enabling a reflow soldering, of increasing the flexibility of design, and of satisfying the requirement of customers are obtained.

According to the present OCXO and the alternate OCXO, by using the pin adapter 5, an effect of preventing heats from being released toward a user board through the base board 1 is obtained.

According to the present OCXO and the alternate OCXO, the flange 51 holds up the pin adapter 5 above the base board 1 to make the contact area smaller, and an effect of decreasing the amount of heats to be conducted is obtained.

According to the present OCXO and the alternate OCXO, the position-determining pins 54 formed on the bottom face of the pin adapter 5 are inserted into the concave portions formed at the corresponding location of the base board 1 to fix the location of the pin adapter, an effect of preventing the pin adapter 5 from being misaligned.

According to the alternate OCXO, by changing the width of the pin according to the type of signals, an effect of improving the temperature-current characteristics is obtained.

The present disclosure is applicable for a surface mount device in which a base board and a main board are connected by a pin adapter that is integrally formed with a plurality of pins, an automatic mounting is enabled, a reflow soldering is enabled, the flexibility of design is enhanced, and the requirement of customers are satisfied.

In the above-mentioned surface mount device, the leg portions that are not connected to the main board, may be folded toward inside on the pin adapter, and opening sections may be formed at the leg portions of the pins in the pin adapter.

In the above-mentioned surface mount device, the position-determining pins may be formed on a bottom face of the pin adapter, concave portions may be formed at positions corresponding to the position-determining pins on the base board, and the position-determining pins of the pin adapter may be inserted into the concave portions of the base board in the above mentioned surface mount device.

The above-mentioned surface mount device may further comprise a flange that is projected toward the base board on a lateral face of the pin adapter, the flange holding up a bottom face of the pin adapter from a surface of the base board.

In the above-mentioned surface mount device, the pin adapter may have a support portion that wraps around the pins and supports the pins.

In the above-mentioned surface mount device, widths of the pins that are connected to the ground and the power supply may be wider than the widths of the other pins.

According to the present disclosure, the surface mount device comprises a pin adapter that has a plurality of pins and is fixed on a base board, narrowly-formed tips of the pins are inserted into holes made in a main board, and the man board and the base board are connected. Therefore, an automatic mounting and a reflow soldering can be used, and flexibility of design can be increased.

According to one of the aspects of the present disclosure, a pin adapter that is formed by integrating a plurality of vertically standing metallic pins is placed on a base board, the tips of the pins are inserted into holes made at corresponding positions of a main board, the main board and the base board are connected with each other, and a cover that covers the main board and the pin adapter is arranged in the surface mount device. Therefore, an automatic mounting and a reflow soldering can be used, and flexibility of design can be increased.

What is claimed is:

1. A surface mount device, comprising:
    a main board on which electronic components are mounted;
    a base board; and
    a pin adapter, having a plurality of pins, and the pin adapter is fixed on the base board;
    wherein tips of the pins that are narrower than the other portions of the pins are inserted into holes disposed in the main board; and
    the main board and the base board are connected with each other,
    wherein the base board has no holes for inserting the pins, and
    a folded bottom portion of the pin and an electrode pattern disposed on a surface of the base board are electrically connected.

2. The surface mount device according to claim 1, wherein in the pin adapter, leg portions of the pins which is at a side not being connected to the main board are folded toward inside on the pin adapter, and
opening sections are formed at the leg portions of the pins.

3. The surface mount device according to claim 1, wherein position-determining pins are formed on a bottom face of the pin adapter;
concave portions are formed at positions corresponding to the position-determining pins on the base board; and
the position-determining pins of the pin adapter are inserted into the concave portions of the base board.

4. The surface mount device according to claim 1, further comprising:
    a flange that is projected toward the base board on a lateral face of the pin adapter,
    the flange holding up a bottom face of the pin adapter from a surface of the base board.

5. The surface mount device according to claim 1, wherein in the pin adapter, a support portion is disposed that wraps around the pins and supports the pins.

6. The surface mount device according to claim 1, wherein widths of the pins that are connected to either a ground or a power supply are wider than widths of the other pins.

7. A manufacturing method of a surface mount device, comprising:
    providing a main board on which electronic components are mounted;
    providing a base board;
    providing a pin adapter, formed by integrating a plurality of metallic pins stood in a vertical direction and the pin adapter is placed on the base board, wherein tips of the pins are inserted into holes disposed at corresponding positions of the main board to connect the main board and the base board; and
    providing a cover is placed to cover the main board and the pin adapter,
    wherein the base board has no holes for inserting the pins, and
    a folded bottom portion of the pin and an electrode pattern disposed on a surface of the base board are electrically connected.

* * * * *